United States Patent
Hwang

Patent Number: 5,790,112
Date of Patent: Aug. 4, 1998

[54] OSCILLATION AND TRIGGER CIRCUIT FOR VERTICAL SYNCHRONIZING SIGNAL

[75] Inventor: Ho-Dae Hwang, Seoul, Rep. of Korea

[73] Assignee: SamSung Electronics Co., Ltd., Kyungki-do, Rep. of Korea

[21] Appl. No.: 648,504

[22] Filed: May 15, 1996

[30] Foreign Application Priority Data

May 15, 1995 [KR] Rep. of Korea ............... 1995 11878

[51] Int. Cl.[6] ............................................ G09G 5/00
[52] U.S. Cl. .................. 345/213; 345/204; 348/529
[58] Field of Search ........................ 345/211, 213, 345/204; 348/730, 529, 547; 331/20, 21, 22, 23, 47, 48, 55, 172, 173, 187

[56] References Cited

U.S. PATENT DOCUMENTS

| | | | |
|---|---|---|---|
| 4,423,440 | 12/1983 | Tachi | 331/20 |
| 5,530,798 | 6/1996 | Chu et al. | 345/213 |
| 5,555,032 | 9/1996 | Kung | 345/211 |

*Primary Examiner*—Lun-Yi Lao
*Attorney, Agent, or Firm*—Robert E. Bushnell Esq

[57] ABSTRACT

An oscillation and trigger circuit for a vertical synchronizing signal in a display apparatus, the oscillation and trigger circuit comprising: a pulse generator for generating a single pulse for each active cycle of the vertical synchronizing signal; a first signal detector having an input terminal connected to an output terminal of the pulse generator, for determining a state of no input of the vertical synchronizing signal whose frequency is less than a predetermined frequency and for generating a first predetermined signal indicative of the state; a second signal detector having input terminals connected to respective output terminals of the pulse generator and the first signal detector, for checking a time interval of the vertical synchronizing signal input to the pulse generator so as to output a second predetermined signal when the time interval exceeds a predetermined time period and for outputting the second predetermined signal responsive to the first predetermined signal input from the first signal detector; an input signal detector connected to the first signal detector, for determining an input of the vertical synchronizing signal; a multiplexer having a selection input terminal connected to receive the second predetermined signal output from an output terminal of the second signal detector, for selecting for output one of a first clock signal of a predetermined frequency and the vertical synchronizing signal; and a vertical oscillator having an input terminal connected to an output terminal of the multiplexer, for generating a vertical oscillation signal of a predetermined frequency in response to the selected one of the clock signal and the vertical synchronizing signal selected by the multiplexer.

12 Claims, 7 Drawing Sheets

OSCILLATION AND TRIGGER CIRCUIT FOR VERTICAL SYNCHRONIZING SIGNAL

CROSS-REFERENCE TO RELATED APPLICATIONS

This application makes reference to, incorporates herein and claims all benefits accruing under 35 U.S.C. 119 by virtue of a patent application earlier filed in Korean Industrial Property Office, on May 15, 1995, entitled *Trigger and Oscillation Circuit For A Vertical Synchronizing Signal* which was duly assigned Ser. No. 95-11878 by that Office.

BACKGROUND OF THE INVENTION

The present invention relates in general to an oscillation and trigger circuit for vertical synchronizing signals in a display apparatus, and more particularly, to an oscillation and trigger circuit for vertical synchronizing signals for use with a monitor display device which circuit generates a triggered signal output when a vertical synchronizing signal input is in a normal state and outputs a predetermined oscillation frequency when the frequency of the vertical synchronizing signal input drops below a predetermined frequency comprising digital logic integrated circuits thereby enabling a construction of Application Specific Integrated Circuit (ASIC) type circuitry.

Conventionally, a known trigger circuit for vertical synchronizing signal employs a logic integrated circuit, for example Integrated Circuit Part No. LA 7851, comprising a plurality of transistors, of either NPN or PNP type, resistors and capacitors. In addition, a known vertical synchronizing signal oscillation circuit employs an oscillation integrated circuit consisting of a RC oscillator which oscillates by way of charging and discharging operation of a capacitor adapted in the oscillator. It is well known that a capacitor is usually hard to be employed in an integrated circuit as a passive element since it requires a more increased pin configuration. More particularly, only a Bi-CMOS process is able to integrate a capacitor in a digital logic integrated circuitry which is a drawback.

SUMMARY OF THE INVENTION

It is an object of the present invention to provide an oscillation and trigger circuit for a vertical synchronizing circuit which does not employ or RC oscillator nor a charging/discharging capacitor.

It is another object of the present invention to provide an oscillation and trigger circuit for a vertical synchronizing circuit in a display apparatus, which generates a triggered signal output when it receives a vertical synchronizing signal input in a normal state and automatically outputs a signal of predetermined oscillation frequency level when the vertical synchronizing signal input has a frequency level less than a predetermined value.

It is a further object of the present invention to provide an oscillation and trigger circuit for a vertical synchronizing circuit comprised of digital logic integrated circuits, which enables a circuit configuration of Application Specific Integrated Circuit (ASIC) type.

To achieve these and other objects, there is provided an oscillation and trigger circuit for a vertical synchronizing signal including a pulse generator for generating a train of pulses which outputs a pulse signal at each and every input of a vertical synchronizing signal VSYNC, a first signal detector having its input terminal connected to the output terminal of the pulse generator for determining a vertical synchronizing signal VSYNC input at a frequency level of less than a predetermined value to be an input of no vertical synchronizing signal VSYNC and thereby generating a signal of no input detection, a second signal detector having its input terminals connected to respective output terminals of the pulse generator and the first signal detector, for either checking a time delay of a vertical synchronizing signal VSYNC input from the pulse generator and determining a state of no synchronizing signal input when a time delay becomes longer than a predetermined interval of time so as to generate a signal of no input detection, or outputting a predetermined signal indicative of no input detection when the signal of no input detection is supplied at its input terminal from the first signal detector, an input signal detector connected to the first signal detector for detection of an input of vertical synchronizing signal VSYNC, a multiplexer connected to the second signal detector, for selecting a clock signal of a predetermined frequency level to output when the predetermined signal indicative of no input detection is supplied at its input terminal from the second signal detector and for generating a vertical synchronizing signal VSYNC output when there is no signal indicative of no input detection supplied thereto, and a vertical oscillator having its input terminal connected to the output terminal of the multiplexer, for receiving a signal supplied from the multiplexer and utilizing the received signal so as to output a vertical oscillating signal VOSC at a predetermined frequency level.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
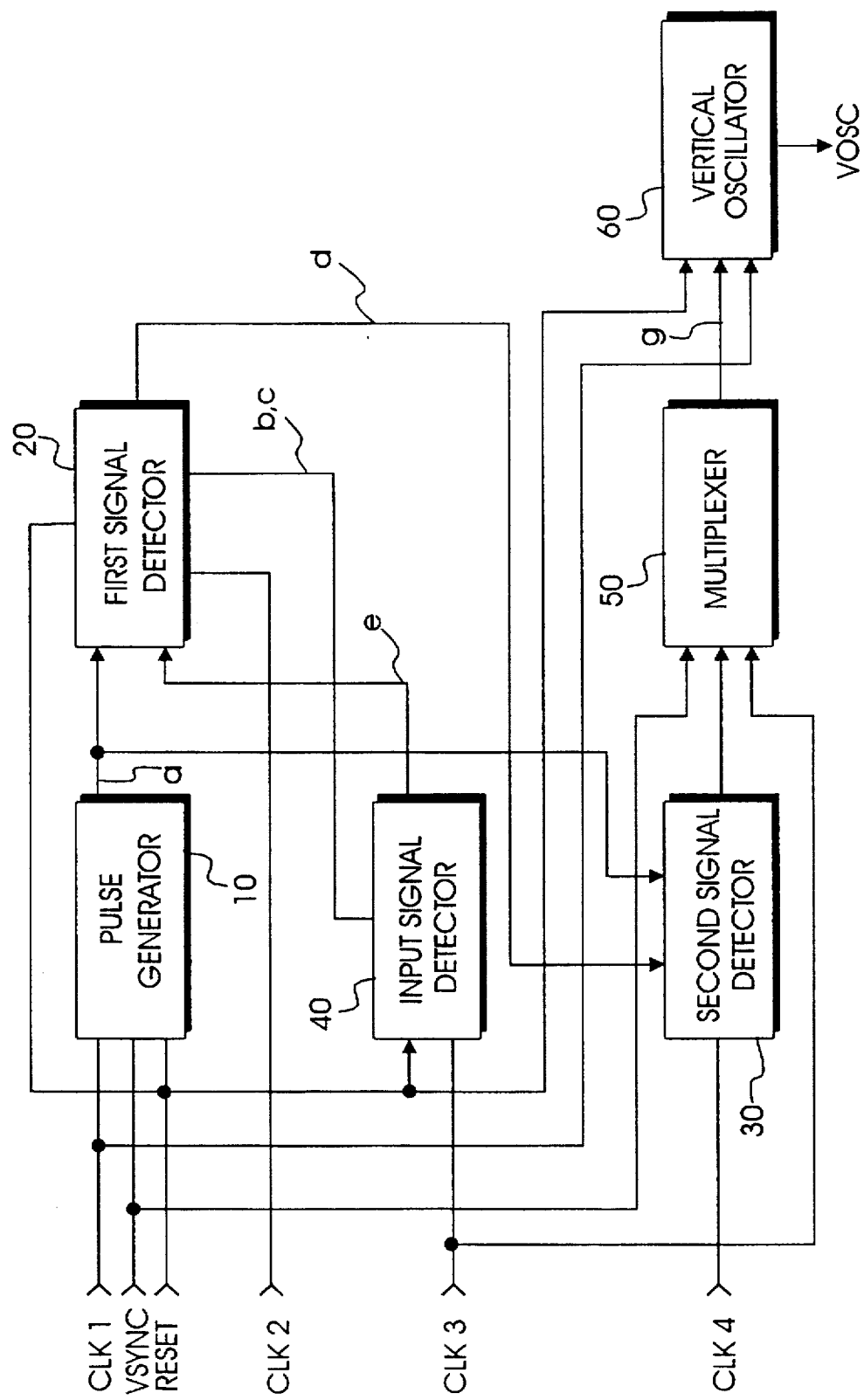
FIG. 1 is a block diagram of an oscillation and trigger circuit for a vertical synchronizing signal constructed according to the principles of the present invention.

Now, by way of a non-limiting example, a preferred embodiment of the present invention will be described in detail. Turning now to the drawings and referring to FIG. 1, a block diagram of an oscillation and trigger circuit for a vertical synchronizing signal according to the principles of the present invention is shown. A reset signal RESET having a predetermined logic value initially energizes, or enables, the circuit. The reset signal RESET in the following descriptions will have a high "1" logic value. Pulse generator 10 is fed with reset signal RESET, a vertical synchronizing signal VSYNC and a first clock signal CLK1. Clock signal CLK1 is a periodic clock of a predetermined period which is supplied from a clock frequency demultiplier (not shown). Pulse generator 10 outputs only a single pulse each time a vertical synchronizing signal VSYNC input is fed to an input terminal thereof. An output terminal (a) of pulse generator 10 is connected to an input terminal of first signal detector 20. Pulse generator 10 will be further described with respect to FIGS. 2 and 7 below. First signal detector 20 determines whether a signal (a) input from pulse generator 10 is representative of a vertical synchronizing signal. An input (a) carrying no vertical synchronizing signal VSYNC, i.e., not representative of a vertical synchronizing signal, is detected when the frequency of the input signal is less than a predetermined frequency level. Respective output terminals of pulse generator 10 and first signal detector 20, (a) and (d), are commonly connected to input terminals of second signal detector 30. Accordingly, a train of time intervals of input vertical synchronizing signals VSYNC are checked in order to determine that a signal input carrying no vertical synchronizing signal VSYNC is detected when a time interval exceeds a predetermined time limit preset in second signal detector 30.

First signal detector 20 is connected to input signal detector 40 which detects an input of vertical synchronizing signal VSYNC. An output terminal of second signal detector 30 is connected to an input terminal of multiplexer 50. According to a signal input from second signal detector 30, multiplexer 50 selects a signal between a vertical synchronizing signal VSYNC input or a predetermined frequency input, namely third clock signal CLK3 so as to output a signal at its output terminal (g). Vertical oscillator 60 having its input terminal connected to an output terminal (g) of multiplexer 50, generates a vertical oscillation signal VOSC of a predetermined frequency level according to a signal input from multiplexer 50. First clock signal CLK1 is fed to vertical oscillator 60. Vertical synchronizing signal VSYNC is applied to multiplexer 50. Reset signal RESET is commonly supplied to first signal detector 20, input signal detector 40 and vertical oscillator 60. Second clock signal CLK2 is fed to first signal detector 20. Third clock signal CLK3 is applied to input signal detector 40 and multiplexer 50. Fourth clock signal CLK4 is supplied to second signal detector 30.

Figure 2:
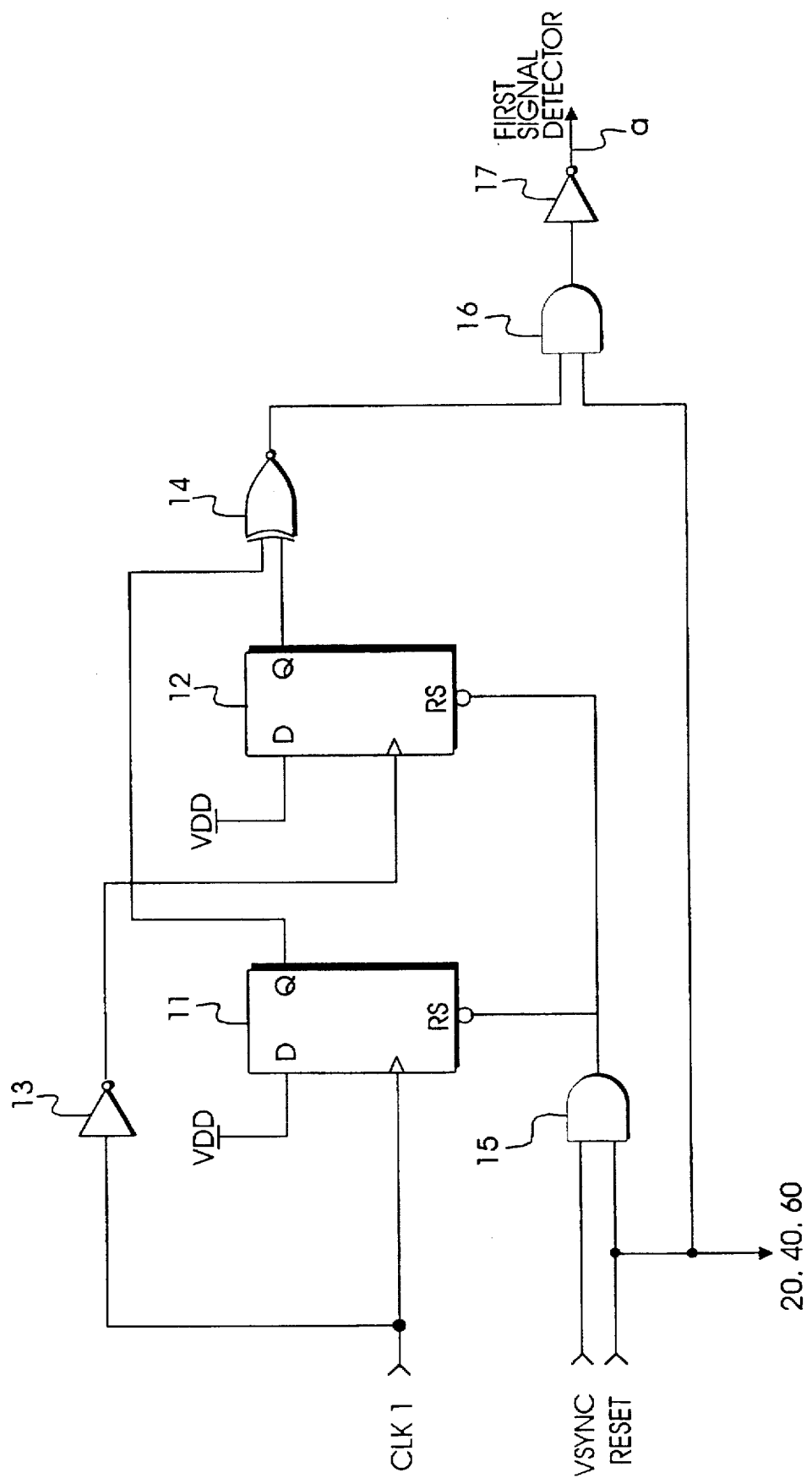
FIG. 2 is a circuit diagram of one preferred embodiment of the pulse generator according to the principle of the present invention, as shown in FIG. 1.

Referring to FIG. 2, a circuit diagram of pulse generator 10 in FIG. 1, constructed according to the principles of the present invention, is shown. The circuit of FIG. 2, as illustrated, is a circuit which generates a single pulse each time a vertical synchronizing signal VSYNC is applied to its input terminal. First clock signal CLK1 is applied to a clock input terminal of flip-flop 11 and to a clock input terminal of flop-flop 12 via inverter 13. Both reset terminals RS of flip-flops 11 and 12 are connected to an output terminal of AND gate 15 which provides a logical product of reset signal RESET and vertical synchronizing signal VSYNC. A logical high level voltage is supplied by a substantially constant voltage source VDD to respective input terminal D of both flip-flops 11 and 12. The Q output terminals of flip-flops 11 and 12 are connected to respective input terminals of exclusive NOR gate 14. Reset signal RESET is also applied to one input terminal of AND gate 16, while another input terminal of AND gate 16 is connected to an output terminal of exclusive NOR gate 14. An output terminal of AND gate 16 is connected to an input terminal of inverter 17 so as to output a vertical pulse output signal to first signal detector 20 and second signal detector 30.

As constructed above, a vertical synchronizing signal VSYNC having the signal waveform shown in (A) of FIG. 7, is applied to one input terminal of AND gate 15. Since a reset signal RESET has already been applied to the other input terminal of AND gate upon initialization, the reset signal RESET being in a state of logic high, then a signal of high state is output by AND gate 15 and supplied to each the reset terminals RS of flip-flops 11 and 12 thereby actuating the flip-flops. In addition, when first clock signal CLK1 as illustrated in (B) of FIG. 7 is fed to the clock input terminals of flip-flops 11 and 12, both having been enabled by an input signal of high level signal at RS, flip-flop 11 generates a signal of waveform (C) as shown in FIG. 7 at its output terminal Q during the first rising edge of first clock signal CLK1 encountered while enabled by the logic high input at its terminal RS.

Flip-flop 12 is fed with an inverted first clock signal CLK1 via inverter 13 at its clock input terminal and generates a signal of waveform (D) as shown in FIG. 7 at its output terminal Q during the first falling edge of first clock signal CLK1, which would be the first rising edge of the inverted first clock signal, encountered while enabled by the logic high input at its terminal RS.

The signals (C) and (D), respectively output by flip-flops 11 and 12, are applied to input terminals of exclusive NOR gate 14. Accordingly, XNOR gate 14 will output a signal having a high logic state where signal (C) and (D) have the same logic value, and a low logic state where signals (C) and (D) have different logic values. Therefore, the output of XNOR 14 would be the opposite of signal (E) shown in FIG. 7. The output of XNOR 14 is applied to one terminal of AND gate 16 and the other input terminal of AND gate 16 is connected to reset signal RESET which has a high logic value. The output of AND gate 16 is applied to inverter 17 which outputs a signal (a) having the waveform (E) shown in FIG. 7.

Figure 3:
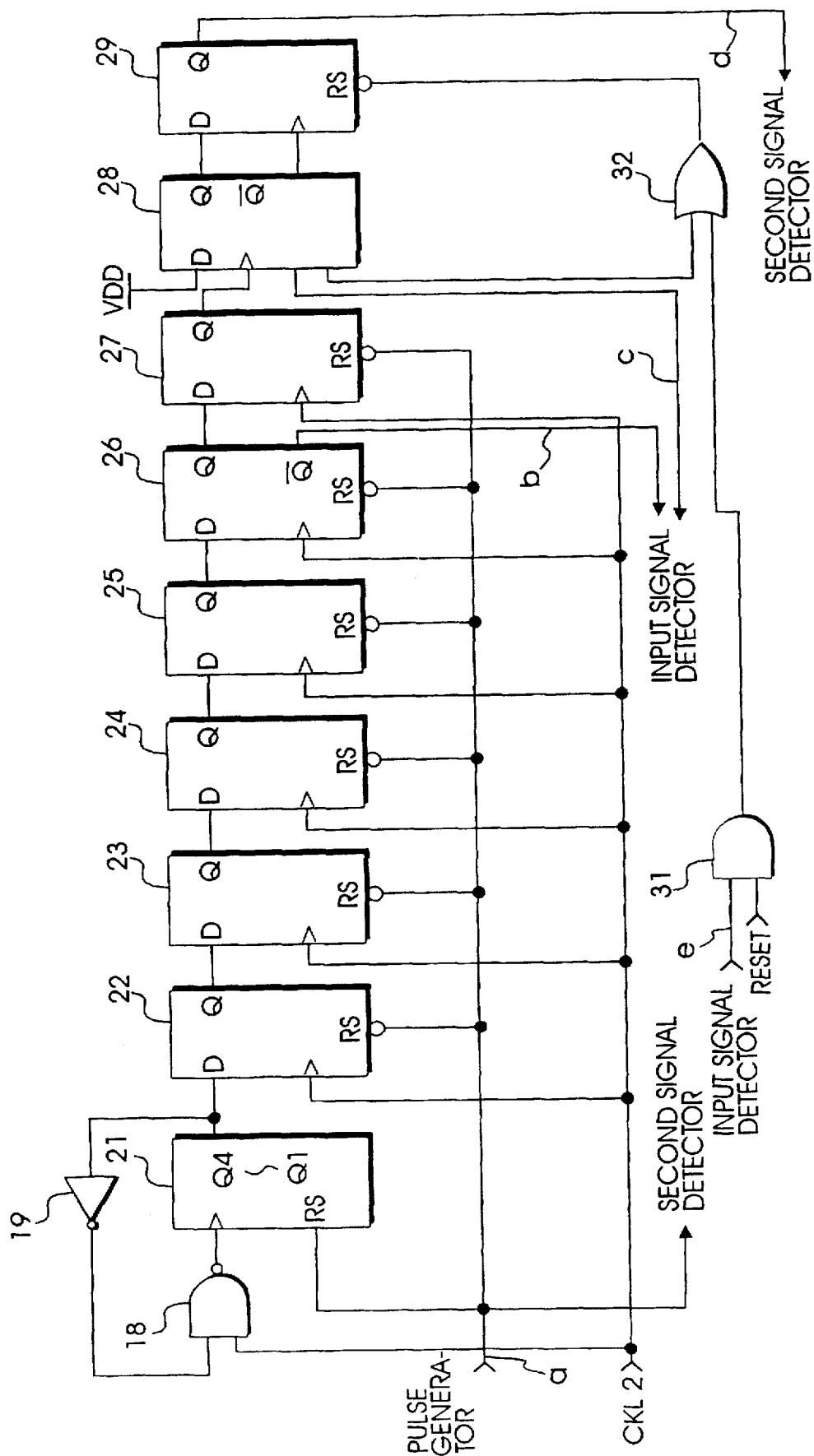
FIG. 3 is a circuit diagram of one preferred embodiment of first signal detector according to the principle of the present invention, as shown in FIG. 1

Referring now to FIG. 3, a schematic circuit diagram of the first signal detector 20 of FIG. 1 is shown. The output (a), signal (E) of FIG. 7, of first signal detector 20 is input to the reset terminals RS of a counter 21 and a series of flip-flops 22–27. A second clock signal CLK2 which is frequency demultiplied at a predetermined period by a clock frequency demultiplier (not shown) applied to a NAND gate 18 whose output terminal is connected to the clock input terminals of counter 21. An output terminal Q4 of counter 21 is connected to another input of NAND gate 18 via inverter 19. Clock signal CLK2 is also input to the clock terminals of flip-flops 22–27. The output Q4 of counter 21 is also connected to the data input terminal D of flip-flip 21. The plurality of flip-flops 22–27 are serially connected so that the output terminals Q of are connected to the data input terminal D of the next succeeding adjacent flip-flop.

A signal output (b) from the $\overline{Q}$ output terminal of flip-flop 26 is supplied to an input terminal of input signal selector 40. The Q output terminal of flip-flop 27 is connected to the clock terminal of flip-flop 28 whose output terminals Q and $\overline{Q}$ are connected, respectively, to the D and clock input terminals of flip-flop 29. Flip-flop 28 also provides an output (c) connected to an input terminal of input signal detector 40 and an output connected to an input terminal OR gate 32. An AND gate 31 receives at one input terminal an output (e) from input signal detector 40 and the reset signal RESET at another input terminal. The output of AND gate 31 is applied to another input terminal of OR gate 32. The output terminal of OR gate 32 is connected to the reset terminal RS of flip-flop 29. The signal output (d) from the Q output terminal of flip-flop 29 is applied to an input terminal of second signal detector 30.

When a pulse of low logic state is supplied from pulse generator 10 is input to the reset terminals RS of counter 21 and flip-flops 22–27, then each Q output signal of counter 21 and flip-flops 22–27 is set to a low logic state and the $\bar{Q}$ output of flip-flop 26 is set to a high logic state. Consequently, since signal (a) output by pulse generator 10 is generated in response to each input of a vertical synchronizing signal VSYNC, counter 21 and flip-flops 22–27 are enabled each time a high logic state is applied to reset terminals RS. Second clock CLK2 is a reference clock signal provided so as to determine the frequency of vertical synchronizing signal VSYNC which correspondingly represents the timing interval of pulse signal (a). When a pulse signal output from pulse generator 10 is applied to reset terminal RS of counter 21, counter 21 is enable to count the train of pulses of clock signal CLK2. Counter 21 counts an input clock signal from (0000) to (1000) at which time it outputs a signal of high logic state at its output terminal Q4.

Accordingly, flip-flop 22 receives a high logic level signal at its D input after the seventh pulse of second clock signal CLK2 is fed to NAND gate 18. This high logic level signal is therefore shifted through flip-flop 26 when counter 21 counts the twelfth pulse of second clock signal CLK2. If pulse generator 10 is not able to output a signal of low logic level by the twelfth pulse of clock signal CLK2, flip-flop 26 outputs signal (b) to input signal detector 40. The clock signal is received at the clock input terminal of flip-flop 29 upon the fourteenth cycle.

Therefore, when the frequency of the vertical synchronizing signal VSYNC is less than a predetermined value, for example, below a frequency level of 31.4 Hz, flip-flop 28 outputs a signal of high logic state at its output terminal. Otherwise, when the vertical synchronizing signal VSYNC is greater than a predetermined value, for example, a frequency level of 36.4 Hz then flip-flop 29 output a signal of low logic state at its Q output terminal. In addition, the signal output (a) of pulse generator 10 is fed to second signal detector 30 as is the output signal (d) of flip-flop 29. An output signal of AND gate 31, which is the logic product of output signal (e) of input signal detector 40 and reset signal RESET, is fed to OR gate 32 whose output is supplied to the reset terminal RS of flip-flop 29.

Figure 4:
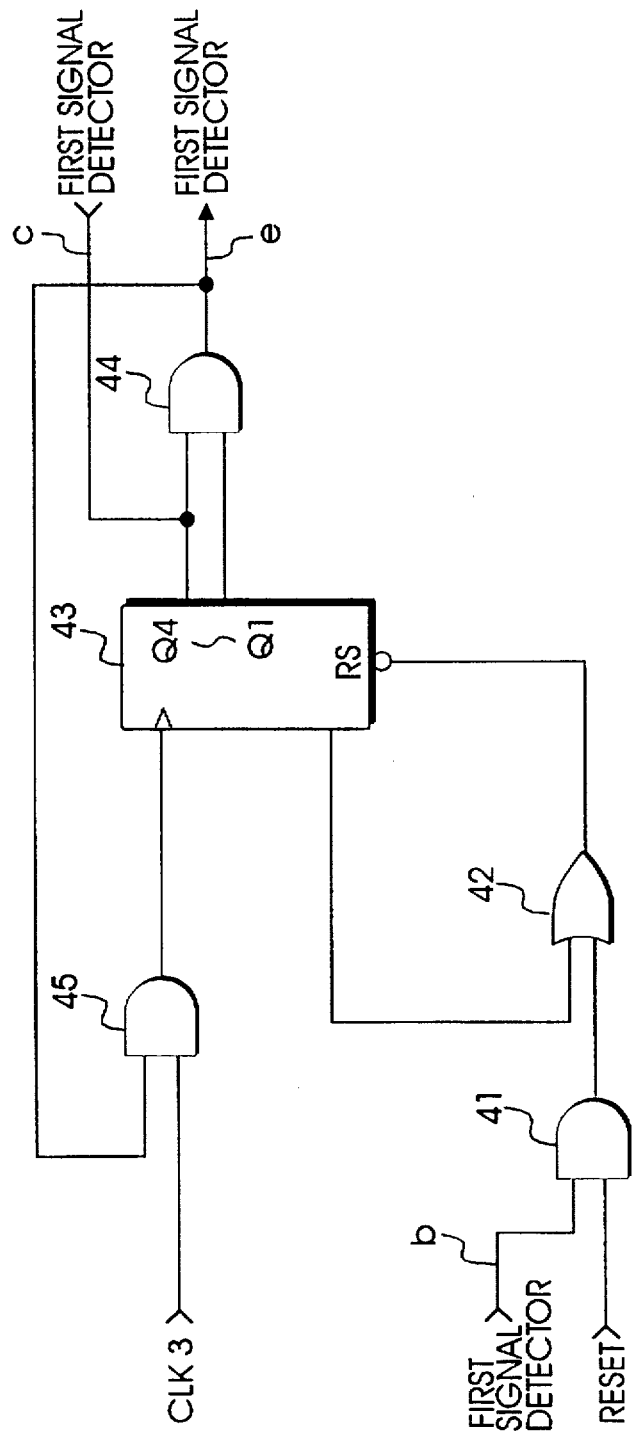
FIG. 4 is a circuit diagram of one preferred embodiment of input signal detector according to the principle of the present invention, as shown in FIG. 1.

Referring now to FIG. 4, a circuit diagram of input signal detector 40 of FIG. 1, is schematically illustrated. AND gate 45 receives third clock signal CLK3 at one of its input terminals and has its output terminal connected to the clock terminal of counter 43. Two output terminals among output terminals Q1–Q4 of counter 43 are connected to a couple of input terminals of AND gate 44 whose output (e) is fed back to another input terminal of AND gate 45 and to first signal detector 20. An output signal (b) of first signal detector 20 and a reset signal RESET are fed to a pair of input terminals of AND gate 41 whose output terminal is connected to one input terminal of OR agate 42. Another output terminal of counter 43 is connected to other input terminal of OR gate 42. An output terminal of OR gate 42 is connected to a reset terminal RS of counter 43. An output signal (c) of first signal detector 20 is connected, in common with one of the output terminals Q1–Q4 of counter 43, to one input terminal of AND gate 44.

Counter 43 is employed in order to delay a vertical synchronizing signal input for a predetermined time interval, for example, 220 msec. When AND gate 41 performs a logic product operation between reset signal RESET and signal output (b) of first signal detector 20 resulting in an output of a low level signal, and a signal output from counter 43 becomes low state as well, then OR gate 42 outputs a low level signal thereby resetting counter 43, causing counter 43 to initiate a counting operation. Counter 43 counts a clock signal applied at its clock input terminal for a predetermined time interval, which is supplied from AND gate 45 as a train of third clock signal CLK3 applied to an input terminal of AND gate 45. Here, if a reset signal is not fed to reset terminal RS of counter 43, AND gate 44 having connected its input terminals to a pair of output terminals of counter 43 generates an output signal (e) which is supplied to first signal detector 20, responsive to the combination of signal polarities applied to a pair of its input terminals. In addition, a signal output (c) of first signal detector 20 is applied to an input terminal of AND gate 44 so as to control the output (e) thereof.

Figure 5:
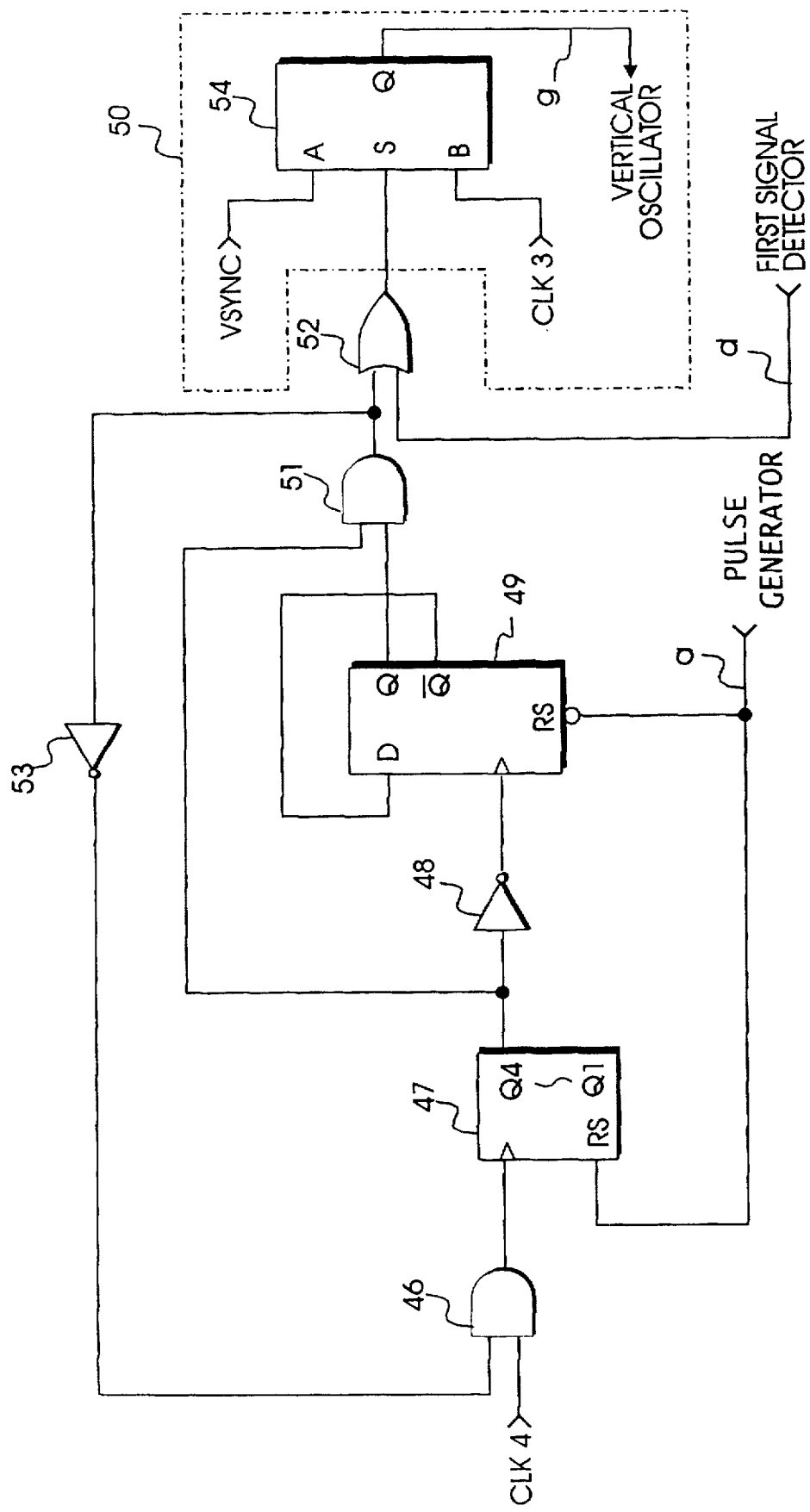
FIG. 5 illustrates a schematical circuit diagram of one preferred embodiment of both multiplexer and second signal detector of FIG. 1.

Turning now to FIG. 5, a schematic diagram of a combination of second signal detector 30 and multiplexer 50 are shown. Fourth clock signal CLK4 is fed to one input terminal of AND gate 46 whose output terminal is connected to a clock terminal of counter 47. An output terminal Q1–Q4 of counter 47 is connected to an input terminal of inverter 48 and an input terminal of AND gate 51. Inverter 48 has its output terminal connected to a clock terminal of flip-flop 49 whose inverting output terminal $\bar{Q}$ is fed back and connected to its input terminal D. An output terminal Q of flip-flop 49 is connected to another input terminal of AND gate 51 whose output terminal is connected to one input terminal of OR gate 52 and also to another input terminal of AND gate 46 via inverter 53. An output signal (d) of first signal detector 20 is connected to another input terminal of OR gate 52. Both reset terminals RS of counter 47 and flip-flop 49 receives a signal output (a) from pulse generator 10 (FIG. 1). An output terminal of OR gate 52 is connected to switching input terminal S of multiplexer 54 in multiplexer circuitry 50.

A vertical synchronizing signal and third clock signal CLK3 are applied to respective input terminals A and B of multiplexer 54. An output terminal Q of multiplexer 54 is connected to vertical oscillator 60.

As constructed above, a signal output (a) from pulse generator 10 (FIG. 1), resets both counter 47 and flip-flop 49. Counter 47 initiates its counting operation once fourth clock signal CLK4 having a predetermined frequency period is applied to the clock terminal thereof via AND gate 46. Counter 47 counts from a number equal to (0000) till it reaches (1000) where it outputs a high level signal at its output terminal Q4. Namely, after seven pulses of clock signal CLK4 and during the time period of the eighth clock pulse, flip-flop 49 is fed with a low level signal via inverter 48, and AND gate 51 is fed with the high logic state of Q4 output by counter 47. AND gate 51 generates a signal of high level if subsequent input signal (f) of first signal detector 20, or (a) of pulse generator 10, is not available within a prescribed time interval. Thus, when a signal of high level either from AND gate 51 or output signal (d) from first signal detector 20 is input to Or gate 52, then OR gate 52 outputs a high level signal.

As a result, the high state signal is fed to switching input terminal S of multiplexer 54 to cause output terminal Q thereof to generate a third clock signal CLK3 input via input terminal B. To the contrary, when a low level signal is output from OR gate 52, multiplexer 54 outputs vertical synchronizing signal VSYNC input via input terminal A thereof. Accordingly, the signal selected and output at output terminal Q of multiplexer 54 is supplied to vertical oscillator 60.

Figure 6:
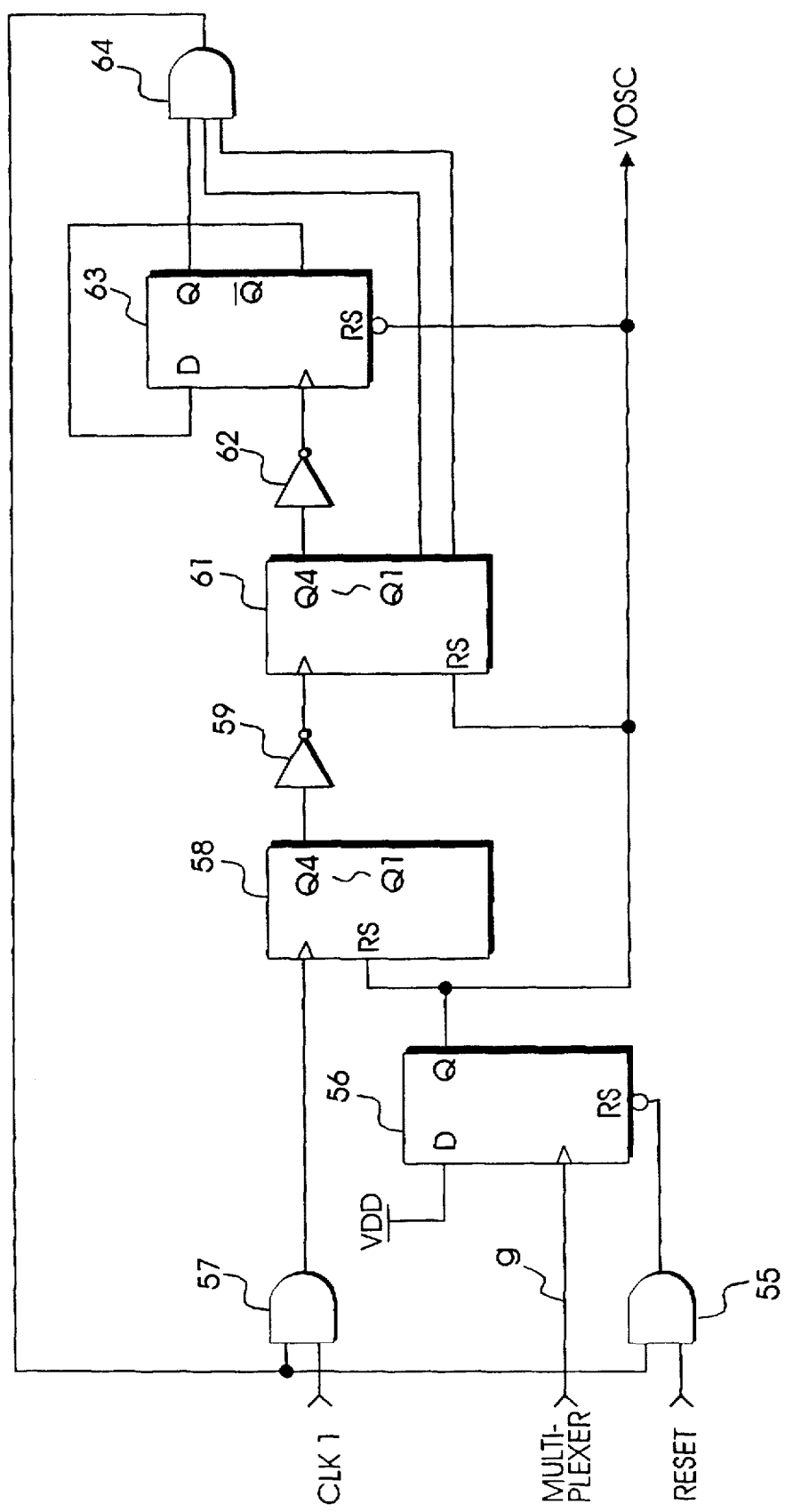
FIG. 6 is a circuit diagram of one preferred embodiment of vertical oscillator according to the principle of the present invention, as shown In FIG. 1.
Figure 7A:
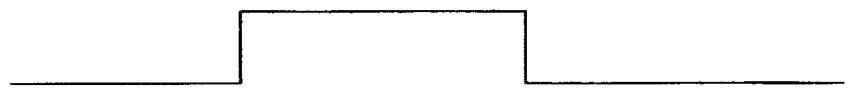
FIGS. 7A–7E illustrates various types of waveforms generated by an operation of pulse generator, constructed as shown in FIG. 2.
Figure 7B:
Figure 7C:
Figure 7D:
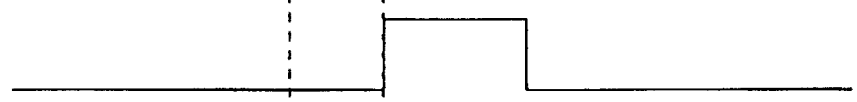
Figure 7E:
Figure 8A:
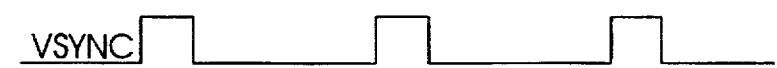
FIGS. 8A through 8D show waveforms of a vertical oscillation signal output generated by on preferred embodiment of the present invention.
Figure 8B:
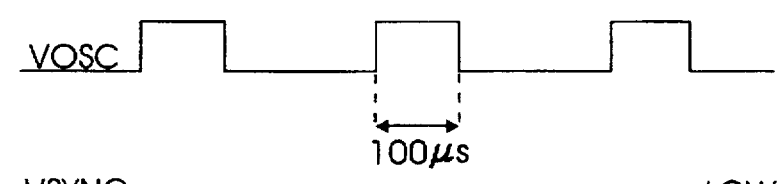
Figure 8C:
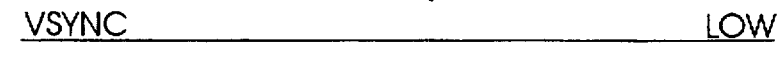
Figure 8D:
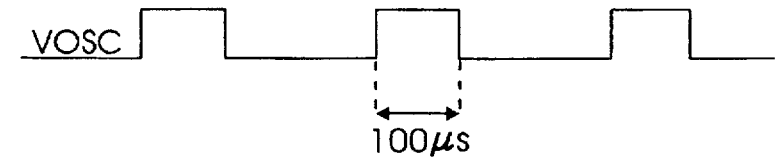

Now referring to FIG. 6, in which a schematic diagram of vertical oscillator 60 as shown in FIG. 1 is illustrated, first clock signal CLK1 is fed to one input terminal of AND gate 57 whose output terminal is connected to a clock input terminal of counter 58. Inverter 59 is connected between an output terminal of counter 58 and the clock input terminal of counter 61, which has an output terminal connected to a clock terminal of flip-flop 63 via inverter 62. Inverting output terminal $\overline{Q}$ of flip-flop 63 is connected to an input terminal D of flip-flop 63, while an output terminal Q of flip-flop 63 is connected to one input terminal of AND gate 64. A couple of output terminals chosen from the terminals Q1 through Q4 of counter 61 are connected to corresponding input terminals of AND gate 64 whose output terminal is commonly connected to another input terminal of AND gate 57 and one input terminal of AND gate 55. Another input terminal of AND gate 55 is fed with reset signal RESET. A signal output of AND gate 55 is applied to a reset terminal RS of flip-flop 56. The output signal (g) of multiplexer 54 is applied to the clock terminal of flip-flop 56. An output terminal Q of flip-flop 56 is commonly connected to the reset terminals RS of flip-flop 63 and counters 58 and 61. Flip-flop 56 also outputs a vertical oscillation signal VOSC from its Q output terminal. According to the configuration constructed above, an output terminal Q of flip-flop 56 generates a signal of high state during a rising edge of a trigger pulse input at a clock input terminal thereof so that all reset operations on flip-flop 63 and counters 58 and 61 are ceased, initiating a 352-count operation performed by both counters 58 and 61 (approximately 100 μsec) thereby causing a signal output of AND gate 64 connected to an output terminal Q of flip-flop 63 to become low level. The output signal from AND gate 64 is fed via AND gate 57 to a clock terminal of counter 58, and is simultaneously fed to a reset terminal RS of flip-flop 56 via AND gate 55, thereby causing a vertical oscillation signal of a predetermined frequency level to be output via the Q output terminal of flip-flop 56.

As stated above, according to the principles of the present invention, two ways for determining a signal indicative of an input of a vertical synchronizing signal VSYNC via pulse generator 20 are disclosed.

Firstly, a signal output at an output terminal Q of flip-flop 29 in first signal detector 20 becomes a high state when vertical synchronizing signal VSYNC frequency is less than 31.4 HZ.

Secondly, a signal of high state is output from an output terminal of AND gate 51 in second signal detector 30 when a frequency period of vertical oscillation signal VSYNC is above 27.36 ms. When a signal between the signal described above is of a high state, a signal output of OR gate 52 in second signal detector 30 becomes a high level thereby causing multiplexer 54 to be controlled. If a vertical synchronizing signal VSYNC is of normal mode operation frequency level, say equal to or above 40 HZ, the output of flip-flop 29 in first signal detector 20 becomes low and that of AND gate 51 in second signal detector 30 also becomes low. As a result, an output signal level of OR gate 52 becomes low thereby causing multiplexer 54 to output a vertical synchronizing signal VSYNC. On other occasions, when a vertical synchronizing signal of DPMS (display power management signaling) mode is input at a frequency level of less than 31.4 HZ or causes a frequency period longer than 27.36 ms, then either an output of flip-flop 29 in first signal detector 20 or an output of AND gate 51 of second signal detector 30 becomes a signal of high level, thereby causing multiplexer 54 to output a third clock signal having a frequency of 54.6 HZ. The output signal of multiplexer 54 is fed to an input terminal of vertical oscillator 60, causing the input signal triggered at each rising edge to become a train of pulse signals which is also a vertical oscillation signal VOSC.

In other words, as shown in (A) and (B) of FIG. 8, a vertical oscillation signal VOSC is output, which is triggered by the train of the signal input of vertical oscillation signal VSYNC. However, as shown in (C) and (D) of FIG. 8, a vertical oscillation signal VOSC triggered by third clock signal CLK3 of 54.6 HZ is output when no train of pulse signals of vertical oscillation signal VSYNC is supplied.

As described and explained above, according to the preferred embodiment of the present invention, an oscillation and trigger circuitry for vertical synchronizing signal employs only digital logic circuitry, reducing a burden of circuit configuration comprised of analog logic integrated circuitry thereby enabling construction by ASIC circuitry.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is inferred that the present invention not be limited to the particular embodiments disclosed as the best mode contemplated for carrying out the present invention, but that the present invention includes all embodiments falling within the scope of the appended claims.

What is claimed:

1. An oscillation and trigger circuit for a vertical synchronizing signal in a display apparatus, said oscillation and trigger circuit comprising:

a pulse generator for generating a single pulse for each active cycle of said vertical synchronizing signal;

a first signal detector having an input terminal connected to an output terminal of said pulse generator, for determining a state of no input of said vertical synchronizing signal whose frequency is less than a predetermined frequency and for generating a first predetermined signal indicative of said state;

a second signal detector having input terminals connected to respective output terminals of said pulse generator and said first signal detector, for checking a time interval of said vertical synchronizing signal input to said pulse generator so as to output a second predetermined signal when said time interval exceeds a predetermined time period and for outputting said second predetermined signal responsive to said first predetermined signal input from said first signal detector;

an input signal detector connected to said first signal detector, for determining an input of said vertical synchronizing signal;

a multiplexer having a selection input terminal connected to receive said second predetermined signal output from an output terminal of said second signal detector, for selecting for output one of a first clock signal of a predetermined frequency and said vertical synchronizing signal;

and a vertical oscillator having an input terminal connected to an output terminal of said multiplexer, for generating a vertical oscillation signal of a predetermined frequency in response to the selected one of said clock signal and said vertical synchronizing signal selected by said multiplexer.

2. The oscillation and trigger circuit as set forth in claim 1, said pulse generator comprising:

a first flip-flop having a clock terminal for receiving a second clock signal and a data input terminal connected to a voltage source;

a first inverter for outputting an inverted second clock signal by inverting said second clock signal;

a second flip-flop having a input terminal for receiving said inverted second clock signal output from said first inverter and a data input terminal connected to said voltage source;

a first AND gate having an output terminal connected to respective reset terminal of said first and second flip-flops, a first input terminal for receiving said vertical synchronizing signal and a second input terminal for receiving a reset signal;

an XNOR gate having a first input terminal connected to a Q output terminal of said first flip-flop and a second input terminal connected to a Q output terminal of said second flip-flop;

a second AND gate having a first input terminal connected to an output terminal of said XNOR gate, a second input terminal for receiving said reset signal and an output terminal; and a second inverter having an input terminal connected to said output terminal of said second AND gate.

3. The oscillation and trigger circuit as set forth in claim 1, said first signal detector comprising:

a NAND gate having a first input terminal for receiving a second clock signal, a second input terminal and an output terminal;

a counter having a clock input terminal connected to said output of said NAND gate, a reset terminal connected to receive said pulse generated by said pulse generator and one of a plurality of output terminals connected to said second input terminal of said NAND gate via an inverter;

six flip-flops connected in series a first one of said six flip-flops having a data input terminal connected to said one of said plurality of output terminals of said counter, wherein each serially succeeding flip-flop has a data input terminal connected to a Q output terminal of a preceding flip-flop, wherein each of said flip-flops has a clock input terminal for receiving said second clock signal and a reset terminal connected to receive said pulse generated by said pulse generator, and wherein a Q output terminal of a fifth one of said six flip-flops is connected of said input signal detector;

a seventh flip-flop having a clock input terminal connected to a Q output terminal of a sixth one of said serially connected six flip-flops, a data input terminal connected to a voltage source and a first output terminal connected to a second input terminal of said input signal detector;

an eighth flip-flop having a data input terminal connected to a Q output terminal of said seventh flip-flop, a clock input terminal connected to a Q output terminal of said seventh flip-flop and a Q output terminal connected to output said first predetermined signal to said second signal detector;

an AND gate having a first input terminal connected an output terminal of said input signal detector, a second input terminal for receiving said reset signal and an output terminal;

an OR gate having a first input terminal connected to a second output terminal of said seventh flip-flop, a second input terminal connected to said output terminal of said AND gate and an output terminal connected to a reset terminal of said eighth flip-flop.

4. The oscillation and trigger circuit as set forth in claim 1, said second signal detector comprising:

a first AND gate having a first input terminal for receiving a second clock signal, a second input terminal and an output terminal;

a second AND gate having a first input terminal, a second input terminal and an output terminal connected to said second input terminal of said first AND gate via a first inverter;

a counter having a clock input terminal connected to said output terminal of said first AND gate, a reset terminal connected to receive said pulse generated by said pulse generator, and one of a plurality of count output terminals connected to an input terminal of a second inverter;

a flip-flop having a reset terminal to receive said pulse generated by said pulse generator, a clock input terminal connected to an output terminal of said second inverter, an data input terminal connected to a $\overline{Q}$ output terminal, and a Q output terminal connected to said second input terminal of said second AND gate; and an OR gate having a first input terminal connected to said output terminal of said second AND gate and a second input terminal connected to receive said first predetermined signal generated by said first signal detector and an output terminal for outputting said second predetermined signal.

5. The oscillation and trigger circuit as set forth in claim 1, said input signal detector comprising:

a first AND gate having a first input terminal connected to a first output terminal of said first signal detector and a second input terminal for receiving a reset signal;

a second AND gate having a first input terminal for receiving said first clock signal, a second input terminal and an output terminal;

a third AND having an output terminal connected to said second input terminal of said second AND gate and to said input terminal of said first signal detector, a first input terminal connected to a second output terminal of said first signal detector and a second input terminal;

an OR gate having a first input terminal connected to said output terminal of said first AND gate, a second input terminal and an output terminal; and a counter having a clock terminal connected to said output terminal of said second AND gate, an output terminal connected to said second input terminal of said OR gate, a reset terminal connected to said output terminal of said OR gate, a first count output terminal connected to said second input terminal of said third AND gate and a second count output terminal connected to said second input terminal of said third AND gate.

6. The oscillation and trigger circuit as set forth in claim 1, said vertical oscillator comprising:

a first AND gate having a first input terminal for receiving a second clock signal, a second input terminal and an output terminal;

a second AND gate having a first input terminal for receiving a reset signal, a second input terminal connected in common with said second input terminal of said first AND gate, and an output terminal; p1 a third AND gate having an output terminal connected to said second input terminals of each of said first and second AND gates;

a first counter having a clock terminal connected to said output terminal of said first AND gate;

a second counter having a clock terminal connected to a count output terminal of said first counter via a first inverter, and a pair of output terminal respective connected to first and second input terminals of said third AND gate;

a first flip-flop having a clock terminal connected to a count output terminal of said second counter via a second inverter, a data input terminal, a $\overline{Q}$ output terminal connected to said data input terminal, and a Q output terminal connected to a third input terminal of said third AND gate; and a second flip-flop having a clock terminal connected to an output terminal of said multiplexer, a reset terminal connected to said output of said second AND gate, a data input terminal connected to a voltage source, and a Q output terminal connected to respective reset terminals of said first counter, said second counter and said first flip-flop, said Q output terminal outputting said vertical oscillation signal.

7. An oscillation and trigger circuit for a vertical synchronizing signal in a display apparatus, said oscillation and trigger circuit comprising:

a pulse generator, responsive to a received first clock signal, a received vertical synchronizing signal and a reset signal, for generating a single pulse for each active cycle of said vertical synchronizing signal;

a first signal detector, responsive to said reset signal, a received second clock signal, said pulse generated by said pulse generator and a vertical detection signal indicative a detected input of said vertical synchronizing signal, for determining a state of no input of said vertical synchronizing signal whose frequency is less than a predetermined frequency and for generating a first predetermined signal indicative of said state;

an input signal detector, responsive to a pair of output signals from said first signal detector, said reset signal and a third clock signal, for generating said vertical detection signal;

a second signal detector, responsive to said pulse generated by said pulse generator, said first predetermined signal generated by said first signal detector and a received fourth clock signal, for checking a time interval of said vertical synchronizing signal input to said pulse generator so as to output a second predetermined signal when said time interval exceeds a predetermined time period;

a multiplexer having a selection input terminal connected to receive said second predetermined signal output from an output terminal of said second signal detector, for selecting for output one of said third clock signal and said vertical synchronizing signal;

and a vertical oscillator responsive to the selected one of said third clock signal and said vertical synchronizing signal selected for output by said multiplexer, said reset signal and said first clock signal, for generating a vertical oscillation signal of a predetermined frequency in response to the selected one of said third clock signal and said vertical synchronizing signal selected by said multiplexer.

8. The oscillation and trigger circuit as set forth in claim 7 said pulse generator comprising:

a first flip-flop having a clock terminal for receiving said first clock signal and a data input terminal connected to a voltage source;

a first inverter for outputting an inverted said first clock signal by inverting said first clock signal;

a second flip-flop having a clock input terminal for receiving said inverted first clock signal output from said first inverter and a data input terminal connected to said voltage source;

a first AND gate having an output terminal connected to respective reset terminal of said first and second flip-flops, a first input terminal for receiving said vertical synchronizing signal and a second input terminal for receiving a reset signal;

an XNOR gate having a first input terminal connected to a Q output terminal of said first flip-flop and a second input terminal connected to a Q output terminal of said second flip-flop;

a second AND gate having a first input terminal connected to an output terminal of said XNOR gate, a second input terminal for receiving said reset signal and an output terminal; and a second inverter having an input terminal connected to said output terminal of said second AND gate for outputting said pulse.

9. The oscillation and trigger circuit as set forth in claim 7, said first signal detector comprising:

a NAND gate having a first input terminal for receiving said second clock signal, a second input terminal and an output terminal;

a counter having a clock input terminal connected to said output of said NAND gate, a reset terminal connected to receive said pulse generated by said pulse generator and one of a plurality of output terminals connected to said second input terminal of said NAND gate via an inverter;

six flip-flops connected in series a first one of said six flip-flops having a data input terminal connected to said one of said plurality of output terminals of said counter, wherein each serially succeeding flip-flop has a data input terminal connected to a Q output terminal of a preceding flip-flop, wherein each of said flip-flops has a clock input terminal for receiving said second clock signal and a reset terminal connected to receive said pulse generated by said pulse generator, and wherein a $\overline{Q}$ output terminal of a fifth one of said six flip-flops is connected to a first input of said input signal detector;

a seventh flip-flop having a clock input terminal connected to a Q output terminal of a sixth one of said serially connected six flip-flops, a data input terminal connected to a voltage source and a first output terminal connected to a second input terminal of said input signal detector;

an eighth flip-flop having a data input terminal connected to a Q output terminal of said seventh flip-flop, a clock input terminal connected to a $\overline{Q}$ output terminal of said seventh flip-flop, and a Q output terminal connected to output said first predetermined signal to said second signal detector;

an AND gate having a first input terminal connected to receive said vertical detection signal output from said input signal detector, a second input terminal for receiving said reset signal and an output terminal;

an OR gate having a first input terminal connected to a second output terminal of said seventh flip-flop, a second input terminal connected to said output terminal of said AND gate and an output terminal connected to a reset terminal of said eighth flip-flop.

10. The oscillation and trigger circuit as set forth in claim 7 said second signal detector comprising:

a first AND gate having a first input terminal for receiving said fourth clock signal, a second input terminal and an output terminal;

a second AND gate having a first input terminal, a second input terminal and an output terminal connected to said second input terminal of said first AND gate via a first inverter;

a counter having a clock input terminal connected to said output terminal of said first AND gate, a reset terminal connected to receive said pulse generated by said pulse generator, and one of a plurality of count output terminals connected to an input terminal of a second inverter;

a flip-flop having a reset terminal to receive said pulse generated by said pulse generator, a clock input terminal connected to an output terminal of said second inverter, an data input terminal connected to a $\bar{Q}$ output terminal, and a Q output terminal connected to said second input terminal of said second AND gate; and an OR gate having a first input terminal connected to said output terminal of said second AND gate and a second input terminal connected to receive said first predetermined signal generated by said first signal detector and an output terminal for outputting said second predetermined signal.

11. The oscillation and trigger circuit as set forth in claim 7, said input signal detector comprising:

a first AND gate having a first input terminal connected to a first output terminal of said first signal detector and a second input terminal for receiving a reset signal;

a second AND gate having a first input terminal for receiving said third clock signal, a second input terminal and an output terminal;

a third AND having an output terminal connected to said second input terminal of said second AND gate and to said input terminal of said first signal detector, a first input terminal connected to a second output terminal of said first signal detector and a second input terminal;

an OR gate having a first input terminal connected to said output terminal of said first AND gate, a second input terminal and an output terminal; and a counter having a clock terminal connected to said output terminal of said second AND gate, an output terminal connected to said second input terminal of said OR gate, a reset terminal connected to said output terminal of said OR gate, a first count output terminal connected to said second input terminal of said third AND gate and a second count output terminal connected to said second input terminal of said third AND gate.

12. The oscillation and trigger circuit as set forth in claim 7, said vertical oscillator comprising:

a first AND gate having a first input terminal for receiving said first clock signal, a second input terminal and an output terminal;

a second AND gate having a first input terminal for receiving a reset signal, a second input terminal connected in common with said second input terminal of said first AND gate, and an output terminal;

a third AND gate having an output terminal connected to said second input terminals of each of said first and second AND gates;

a first counter having a clock terminal connected to said output terminal of said first AND gate;

a second counter having a clock terminal connected to a count output terminal of said first counter via a first inverter, and a pair of output terminal respective connected to first and second input terminals of said third AND gate;

a first flip-flop having a clock terminal connected to a count output terminal of said second counter via a second inverter, a data input terminal, a $\bar{Q}$ output terminal connected to said data input terminal, and a Q output terminal connected to a third input terminal of said third AND gate; and a second flip-flop having a clock terminal connected to an output terminal of said multiplexer, a reset terminal connected to said output of said second AND gate, a data input terminal connected to a voltage source, and a Q output terminal connected to respective reset terminals of said first counter, said second counter and said first flip-flop, said Q output terminal outputting said vertical oscillation signal.

* * * * *